(12) United States Patent
Shirai et al.

(10) Patent No.: US 9,023,950 B2
(45) Date of Patent: May 5, 2015

(54) STAR POLYMER AND METHOD OF PRODUCING SAME

(75) Inventors: Akihiro Shirai, Ichihara (JP); Takeshi Niitani, Ichihara (JP)

(73) Assignee: Nippon Soda Co., Ltd., Tokyo (JP)

( * ) Notice: Subject to any disclaimer, the term of this patent is extended or adjusted under 35 U.S.C. 154(b) by 98 days.

(21) Appl. No.: 13/639,792

(22) PCT Filed: Apr. 18, 2011

(86) PCT No.: PCT/JP2011/002249
§ 371 (c)(1),
(2), (4) Date: Oct. 5, 2012

(87) PCT Pub. No.: WO2011/132395
PCT Pub. Date: Oct. 27, 2011

(65) Prior Publication Data
US 2013/0030127 A1    Jan. 31, 2013

(30) Foreign Application Priority Data
Apr. 21, 2010 (JP) ................................ 2010-097590

(51) Int. Cl.
| | | |
|---|---|---|
| C08F 12/22 | (2006.01) | |
| C08F 297/04 | (2006.01) | |
| C08F 212/14 | (2006.01) | |
| C08F 12/24 | (2006.01) | |
| C08F 297/02 | (2006.01) | |
| G03F 7/039 | (2006.01) | |

(52) U.S. Cl.
CPC ............. C08F 12/22 (2013.01); C08F 297/044 (2013.01); C08F 212/14 (2013.01); C08F 12/24 (2013.01); C08F 297/023 (2013.01); G03F 7/0392 (2013.01)

(58) Field of Classification Search
CPC ........ C08F 12/22; C08F 12/24; C08F 212/14; C08F 297/023; C08F 297/044
USPC ............ 525/328.8, 333.3, 386; 526/313, 334, 526/346
See application file for complete search history.

(56) References Cited

U.S. PATENT DOCUMENTS

| | | | |
|---|---|---|---|
| 4,304,886 A * | 12/1981 | Bean et al. ................ 525/314 |
| 5,336,737 A * | 8/1994 | van Ballegooijen et al. ... 526/70 |
| 5,539,058 A | 7/1996 | Nicol | |
| 5,635,561 A | 6/1997 | Nicol | |
| 6,713,564 B1 * | 3/2004 | Nobuhara et al. .......... 525/328.9 |
| 2004/0054090 A1 | 3/2004 | Bening et al. | |
| 2010/0056748 A1 | 3/2010 | Yano | |

FOREIGN PATENT DOCUMENTS

| | | |
|---|---|---|
| JP | A-03-088803 | 4/1991 |
| JP | A-07-216038 | 8/1995 |
| JP | A-2001-139647 | 5/2001 |
| JP | A-2002-105153 | 4/2002 |
| JP | A-2002-226513 | 8/2002 |
| JP | A-2005-533151 | 11/2005 |
| JP | A-2006-070229 | 3/2006 |
| JP | A-2006-225605 | 8/2006 |
| JP | A-2009-163259 | 7/2009 |
| JP | A-2010-215890 | 9/2010 |
| WO | WO 2004/007581 A1 | 1/2004 |
| WO | WO 2007/029794 A1 | 3/2007 |

OTHER PUBLICATIONS

International Preliminary Report issued in International Application No. PCT/JP2011/002249 dated Nov. 6, 2012.
Nov. 7, 2013 Extended European Search Report issued in European Application No. 11771738.9.
International Search Report issued in International Application No. PCT/JP2011/002249 dated Jul. 12, 2011 (with translation).

* cited by examiner

*Primary Examiner* — Roberto Rabago
(74) *Attorney, Agent, or Firm* — Oliff PLC

(57) ABSTRACT

The present invention provides a styrene-based star polymer with narrow dispersion and suitable as a resist material, etc. A star polymer of the present invention is represented by the formula $A[C(Y)X_m]_n$ (wherein A represents a polyvalent aliphatic hydrocarbon group with 4-15 carbons, C represents a carbon atom, X represents a styrene-based polymer chain, Y represents a hydroxy group or an oxo group, m represents an integer of 1 or 2, and n represents any integer from 2 to 5, with the proviso that if Y is a hydroxy group, m is 2, and if Y is an oxo group, m is 1). The star polymer can be produced by reacting a styrene-based polymer having an anionic end, and an aliphatic carboxylic acid ester represented by $A(COOR)_n$ (wherein R represents an alkyl group having 1-8 carbons, and A and n are as defined for the above formula).

2 Claims, No Drawings

STAR POLYMER AND METHOD OF PRODUCING SAME

TECHNICAL FIELD

The present invention relates to a star polymer and a method for producing the same. The present invention particularly relates to a styrene-based star polymer with narrow dispersion which is suitable as a resist material, etc. and a method for producing the same. The present application claims priority from Japanese Patent Application No. 2010-097590 filed on Apr. 21, 2010, the content of which is incorporated herein.

BACKGROUND ART

A star polymer is a copolymer consisting of a core part and arm parts having polymer chains extended from the core part. Various star polymers have conventionally been developed, but those star polymers with practically suitable physical properties particularly as resist materials have not yet been developed.

On the other hand, among star polymers, examples of the star polymers using a styrene-based polymer as the arm parts include those star polymers described in the following documents.

In Patent Documents 1 and 2, an alkenylphenol-based homopolymer or copolymer is used as the arm parts and a polyfunctional coupling agent is used as the core part which couples the arm part polymers. As the polyfunctional coupling agent, the documents exemplify an aromatic compound such as a divinyl aromatic compound and a trivinyl aromatic compound, diepoxide, diketone, dialdehyde, and a compound represented by general formula $(CR^1R^2X)_nR^3$ (wherein X represents a substituent selected from the group consisting of a halogen atom, alkoxy group having 1-6 carbons and acyloxyl group having 2-6 carbons. $R^1$ and $R^2$ respectively represent a hydrogen atom or a monovalent hydrocarbon group having 1-6 carbons, where $R^1$ and $R^2$ may be the same or different. $R^3$ represents a polyvalent aromatic hydrocarbon group or polyvalent aliphatic hydrocarbon group that may have n $(CR^1R^2X)$ substituents. n represents any integer from 3 to 6).

Further, Patent Document 3 describes using a copolymer of an alkenylphenol derivative and a (meth)acrylate derivative as the arm parts, and using as the core part a polymer chain consisting of the repetition units induced by diacrylate represented by the following formula

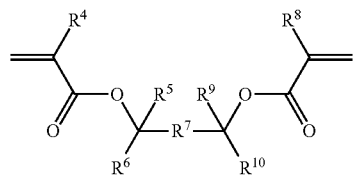

(wherein $R^4$ and $R^8$ each independently represent a hydrogen atom or a methyl group, $R^5$, $R^6$, $R^9$ and $R^{10}$ each independently represent an alkyl group, and $R^7$ represents an alkylene group), and that the core part is bound to polymers of the arm parts.

Still further, Patent Document 4 describes a dendrimer-like star polymer, and describes reacting a compound which has a functional group reactable with anion and which serves as a core part with arm parts which consist of polymers comprising styrene-based repetition units and which are polymer chains having 2 or more anionic ends. As the compound which has a functional group reactable with anion and which serves as a core part, the Patent Document 4 exemplifies chain or cyclic aliphatic, aromatic and heterocyclic compounds and describes that an aromatic compound is particularly preferred.

PRIOR ART DOCUMENTS

Patent Documents

Patent Document 1: Japanese Unexamined Patent Application Publication No. 2001-139647
Patent Document 2: Japanese Unexamined Patent Application Publication No. 2002-226513
Patent Document 3: Japanese Unexamined Patent Application Publication No. 2006-225605
Patent Document 4: WO2007/029794, pamphlet

SUMMARY OF THE INVENTION

Object to be Attained by the Invention

Conventionally, star polymers having styrene-based polymers as the arm parts still did not have properties that are satisfactory to be used as resist materials, etc. Therefore, the object of the present invention is to provide a styrene-based star polymer with narrow dispersion and suitable as a resist material, etc.

Means to Solve the Object

It has conventionally been considered to be good to use an aromatic compound as the core part for a star polymer having styrene-based polymers as the arm parts. Such star polymers, however, were not practical to be used as a resist material due to the slow alkaline dissolution rate. The present inventors, therefore, have made a keen study and found that the alkaline dissolution rate was improved as a result of using particular aliphatic compounds in place of aromatic compounds. The present invention is thus completed.

The present invention relates to:
(1) a star polymer represented by the formula $A[C(Y)X_m]_n$ (wherein A represents a polyvalent aliphatic hydrocarbon group having 4-15 carbons, C represents a carbon atom, X represents a styrene-based polymer chain, Y represents a hydroxy group or an oxo group, m represents an integer of 1 or 2, and n represents any integer from 2 to 5, with the proviso that if Y is a hydroxy group, m is 2, and if Y is an oxo group, m is 1);
(2) the star polymer according to (1), wherein the styrene-based polymer is a homopolymer or copolymer of hydroxystyrene; and
(3) a method for producing the star polymer according to (1) or (2), comprising reacting a styrene-based polymer having an anionic end with an aliphatic carboxylic acid ester represented by $A(COOR)_n$ (wherein R represents an alkyl group having 1-8 carbons, and A and n are as defined for the (1) above).

MODE OF CARRYING OUT THE INVENTION

In the present invention, a star polymer means a polymer in which plural arm parts are bound to the core part. Specifically, a star polymer of the present invention is a polymer having A as the core part to which a styrene-based polymer X is bound as an arm part, and is represented by formula $A[C(Y)X_m]_n$.

In the formula, A represents a polyvalent aliphatic hydrocarbon group having 4-15 carbons, C represents a carbon atom, X represents a styrene-based polymer chain, and Y represents a hydroxy group or an oxo group.

m represents an integer of 1 or 2, and n represents any integer from 2 to 5.

However, if Y is a hydroxy group, m is 2, and if Y is an oxo group, m is 1.

Further, when Y is a hydroxy group, it may form a double bond by being dehydrated together with a hydrogen atom on the carbon atom in the adjacent aliphatic hydrocarbon group.

Each moiety in the formula $A[C(Y)X_m]_n$ is explained in the following.

Note that polyvalent aliphatic hydrocarbon groups having 4-15 carbons for A are shown below with the names for monovalent hydrocarbon groups, but the names of the groups shall be appropriately reworded according to the number of bonds in $C(Y)X_m$.

Examples of the aliphatic hydrocarbon group having 4-15 carbons for A include a straight-chain or branched alkyl group having 4-15 carbons, a straight-chain or branched alkenyl group having 4-15 carbons, and a straight-chain or branched alkynyl group having 4-15 carbons.

Examples of the alkyl group having 4-15 carbons include a n-butyl group, s-butyl group, i-butyl group, t-butyl group, n-pentyl group, n-hexyl group, nonyl group, isononyl group, decyl group, lauryl group, tridecyl group, myristyl group and pentadecyl group. An alkyl group having 4-8 carbons is preferred.

An alkenyl group means an alkyl group having 1 or more double bonds, and examples of the alkenyl group having 4-15 carbons include a 1-butenyl group, 2-butenyl group, 3-butenyl group, 1-methyl-2-propenyl group, 2-methyl-2-propenyl group, 1-pentenyl group, 2-pentenyl group, 3-pentenyl group, 4-pentenyl group, 1-methyl-2-butenyl group, 2-methyl-2-butenyl group, 1-hexenyl group, 2-hexenyl group, 3-hexenyl group, 4-hexenyl group, 5-hexenyl group, heptenyl group, octenyl group, decenyl group, pentadecenyl group and 1,3-butadienyl group. An alkenyl group having 5-8 carbons is preferred.

An alkynyl group means an alkyl group having 1 or more triple bonds, and examples of the alkynyl group having 4-15 carbons include a 1-butynyl group, 2-butynyl group, 3-butynyl group, 1-methyl-2-propynyl group, 2-methyl-2-propynyl group, 1-pentynyl group, 2-pentynyl group, 3-pentynyl group, 4-pentynyl group, 1-methyl-2-butynyl group, 2-methyl-2-butynyl group, 1-hexynyl group, 2-hexynyl group, 3-hexynyl group, 4-hexynyl group, 5-hexynyl group, 1-heptynyl group, 1-octynyl group, 1-decynyl group and 1-pentadecynyl group. An alkynyl group having 4-8 carbons is preferred.

When the number of carbons gets larger, the solubility in an alkaline developing solution gets poorer. However, even though a styrene-based polymer as an arm part gets longer, it provides an effect that the ratio of the unbound and thus remaining styrene-based polymers decreases. When the number of carbons is 3 or less, the ratio of the unbound and thus remaining styrene-based polymers increases due to steric hindrance, and desired star polymers cannot be obtained.

A styrene-based polymer for X is a homopolymer, random copolymer or block copolymer having a repetition unit represented by the following formula (I)

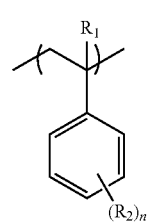

(wherein $R_1$ represents a hydrogen atom or a methyl group, $R_2$ represents a hydroxy group, an alkyl group or an optionally substituted alkoxy or aryl group, and n represents any integer from 0 to 3).

Specifically, as for $R_2$ in formula (I), the alkyl group is exemplified by a methyl group, ethyl group, n-propyl group, isopropyl group, n-butyl group, isobutyl group, s-butyl group, t-butyl group, n-pentyl group, isopentyl group, s-pentyl group, t-pentyl group, neopentyl group, n-hexyl group, n-heptyl group, n-octyl group, n-nonyl group, n-decyl group, etc. (preferably, a C1-C6 alkyl group); the alkoxy group is exemplified by a methoxy group, ethoxy group, n-propoxy group, isopropoxy group, n-butoxy group, isobutoxy group, s-butoxy group, t-butoxy group, n-pentoxy group, isopentoxy group, s-pentoxy group, t-pentoxy group, neopentoxy group, n-hexyloxy group, n-heptyloxy group, n-octyloxy group, n-nonyloxy group, n-decyloxy group, etc. (preferably, a C1-C6 alkoxy group); the substituted alkoxy group exemplified by an alkoxy group, for example, substituted by a halogen atom, alkoxy group, etc. and the specific examples include 2-chloroethoxy group and 2-ethoxyethoxy group; the aryl group is exemplified by a phenyl group, 1-naphthyl group and 2-naphthyl group (preferably a C6-C10 aryl group); the substituted aryl group is exemplified by an aryl group substituted by a halogen atom, alkyl group, etc. and specific examples include a 4-chlorophenyl group and 4-methylphenyl group.

Other repetition units of a styrene-based copolymer are not particularly limited as long as it is a monomer-derived repetition unit which is copolymerizable with a styrene-based monomer. The examples include a repetition unit represented by the following formula (II)

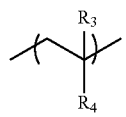

[wherein $R^3$ represents a hydrogen atom or a C1-C6 alkyl group, $R^4$ represents a hydrogen atom, a C1-C6 alkyl group or a group represented by the formula: $—CR_5=CH_2$ (wherein $R_5$ is a hydrogen atom or a methyl group)], and a repetition unit represented by the following formula (III)

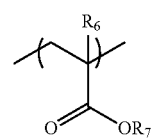

(wherein $R^6$ represents a hydrogen atom or a methyl group, $R^7$ represents a hydrogen atom, C1-C12 alkyl group, a hydrocarbon group with 3 or more carbons which has an alicyclic backbone and may have a substituent, an alkyl group comprising a hydrocarbon group with 3 or more carbons which has an alicyclic backbone and may have a substituent, and a phenyl or heterocyclic group which may have a substituent).

In the above formulae (II) and (III), examples of the C1-C6 alkyl group and C1-C12 alkyl group include a methyl group, ethyl group, n-propyl group, isopropyl group, n-butyl group, isobutyl group, s-butyl group, t-butyl group, n-pentyl group, isopentyl group, s-pentyl group, t-pentyl group, neopentyl group, n-hexyl group, n-heptyl group, n-octyl group, n-nonyl group and n-decyl group.

In the above formula (III), examples of the hydrocarbon group with 3 or more carbons which has an alicyclic backbone include a cycloalkyl group such as a cyclopropyl group, cyclopentyl group, cyclohexyl group and cyclooctyl group; and a cycloalkenyl group such as a cyclobutenyl group, cyclopentenyl group, cyclohexenyl group and cyclooctenyl group (C3-C6 hydrocarbon groups are preferred).

In the above formula (III), examples of the alkyl group comprising a hydrocarbon group with 3 or more carbons which has an alicyclic backbone include a cycloalkyl alkyl group such as a cyclopropylmethyl group, 2-cyclopentylethyl group, cyclohexylmethyl group; and a cycloalkenylalkyl group such as cyclobutenylmethyl group, cyclopentenylethyl group, cyclohexenylmethyl group, and cyclooctenylmethyl group (C4 to C12 is preferred).

In the above formula (III), a heterocyclic group means a 5-7 membered aromatic heterocyclic ring, a saturated heterocyclic ring and an unsaturated heterocyclic ring that have 1 to 4 nitrogen atoms, oxygen atoms or sulfur atoms as the hetero atoms, or a condensed heterocyclic ring formed by condensation of said heterocyclic rings and a benzene ring, and the examples include a fran-2-yl group, thiophene-2-yl group, pyrrole-1-yl group, pyridine-2-yl group, pyrazine-2-yl group, pyrimidine-2-yl group, pyridazine-3-yl group, 1,3-benzodioxole-4-yl group, 1,4-benzodioxan-5-yl group, 2,3-dihydrobenzofuran-5-yl group, indoline-5-yl group, morpholine-4-yl group, piperazine-2-yl group, and piperidine-2-yl group.

In the above formula (III), examples of the substituent in terms of "which may have a substituent" include a halogen atom, alkyl group, alkoxy group and aryl group.

The number average molecular weight of a styrene-based polymer chain is not particularly limited, but a number average molecular weight of 1,000 to 100,000 is preferred. Ratio (Mw/Mn) of a weight average molecular weight (Mw) to a number average molecular weight (Mn) is preferably 1.01 to 1.50. Further, the non-binding end of a styrene-based polymer chain may either be a hydrogen atom or be substituted.

n represents the number of bonds of $C(Y)X_m$. Limitation on the number of bonds of $C(Y)X_m$ varies depending on the aliphatic hydrocarbon groups, but usually 2 to 5.

The number average molecular weight of a star polymer of the present invention is not particularly limited, but a number average molecular weight of 4,000 to 1,000,000 is preferred. The ratio (Mw/Mn) of a weight average molecular weight (Mw) to a number average molecular weight (Mn) is preferably 1.01 to 1.50.

Shown below are specific examples of star polymers represented by the formula: $A[C(Y)X_m]_n$. Note that these are examples of when two Xs are bound to a carbon atom represented by C.

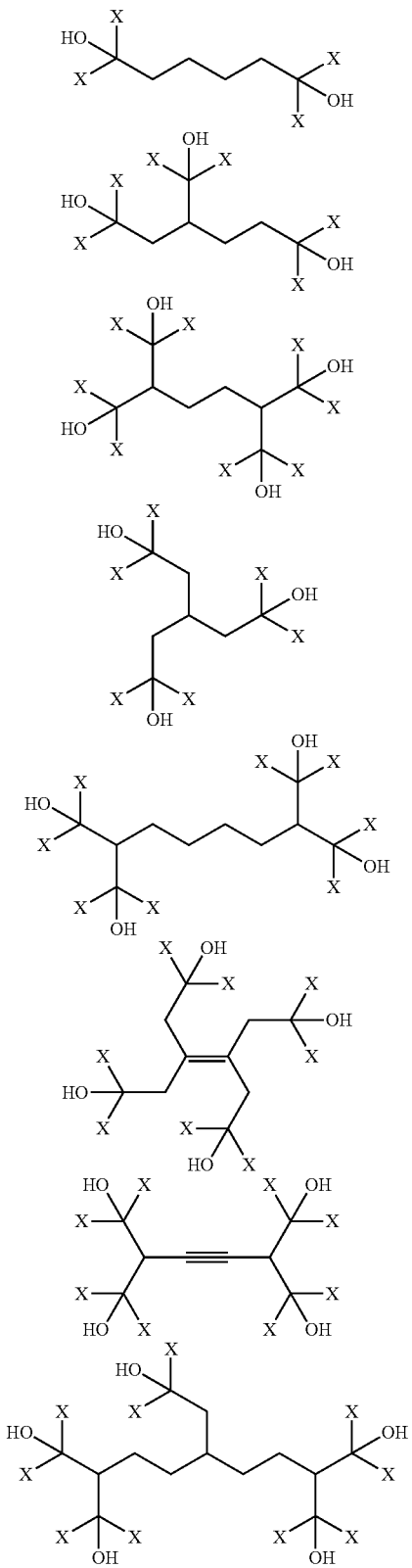

When only a single X is bound to a single ester group in the star polymers exemplified above, star polymers in which OH is replaced by an oxo group are exemplified. Further, when OH is dehydrated together with a hydrogen atom on a carbon atom in the adjacent aliphatic hydrocarbon group, star polymers are exemplified that are devoid of OH and comprise formation of a double bond with the adjacent carbon atom.

(Method for Producing a Star Polymer)

While a star polymer of the present invention can be produced according to known methods, it can be produced, for example, in the following manner.

First, arm part polymers are produced by an anionic polymerization method using an anionic polymerization initiator as a polymerization initiator. In doing so, a homopolymer or a copolymer may be produced by polymerizing a mixture of 1 or 2 or more styrene-based compounds that are material monomers for a repetition unit in the above formula (I). A block copolymer may also be produced by sequentially adding 2 or more kinds of styrene-based compounds and then polymerizing these compounds.

Alternatively, copolymerization may be conducted using other copolymerizable compounds, for example, a compound which is a material monomer for the repetition unit represented by the above formula (II) or (III).

A star polymer of the present invention can be produced by producing arm part polymers as described above and subsequently reacting the arm part polymers with an aliphatic carboxylic acid ester represented by the formula: $A(COOR)_n$ (wherein A represents a polyvalent aliphatic hydrocarbon group, R represents a C1-C8 alkyl group, and n represents any integer from 2 to 5).

Reaction of arm part polymers and an aliphatic carboxylic acid ester may be conducted either by adding an aliphatic carboxylic acid ester to the reaction solution in which arm parts have been produced, or by adding the arm part polymers to a solution containing an aliphatic carboxylic acid ester.

Among the $A(COOR)_n$ mentioned above, a polyvalent aliphatic hydrocarbon group having 4-15 carbons for A is exemplified by those that are the same as A in the formula: $A[C(Y)X_m]_n$. Examples of the C1-C8 alkyl group for R include a methyl group, ethyl group, n-propyl group, i-propyl group, n-butyl group, s-butyl group, i-butyl group, t-butyl group, n-pentyl group, n-hexyl group and 2-ethylhexyl group.

Examples of the styrene-based compound include styrene, α-methylstyrene, p-hydroxystyrene, p-methylstyrene, p-t-butylstyrene, p-t-butoxystyrene, p-t-butoxy-α-methylstyrene, p-(1-ethoxyethoxy)styrene, and p-(1-ethoxyethoxy)-α-methylstyrene. These may be used alone or as a mixture of 2 or more kinds thereof.

Examples of the compound copolymerizable with a styrene-based compound include butadiene, isoprene, methyl (meth)acrylate, ethyl(meth)acrylate, n-butyl(meth)acrylate, t-butyl(meth)acrylate, hexyl(meth)acrylate, ethylcyclohexyl (meth)acrylate, phenyl(meth)acrylate, and pyridyl(meth) acrylate. These may be used alone or as a mixture of 2 or more kinds thereof.

A synthetic reaction of arm part polymers are usually conducted in an organic solvent at a temperature range of −100 to 50° C., preferably −78 to 40° C. in an inert gas atmosphere such as nitrogen and argon.

Examples of the organic solvent used in the synthetic reaction of arm part polymers include aliphatic hydrocarbons such as n-hexane and n-heptane; alicyclic hydrocarbons such as cyclohexane and cyclopentane; aromatic hydrocarbons such as benzene and toluene; and ethers such as diethylether, tetrahydrofuran (THF) and dioxane. In addition to these, organic solvents that are usually used in the anionic polymerization, such as anisole and hexamethylphosphoramide, are exemplified. These organic solvents may be used alone or as a mixed solvent comprising at least two kinds thereof. Among these organic solvents, a mixed solvent of tetrahydrofuran and toluene, a mixed solvent of tetrahydrofuran and hexane, and a mixed solvent of tetrahydrofuran and methylcyclohexane are preferably exemplified in view of polarity and solubility.

Examples of the anionic polymerization initiator used in the above-mentioned anionic polymerization method include an alkali metal and an organic alkali metal. Examples of the alkali metal include lithium, sodium, potassium and cesium. Examples of the organic alkali metal include alkylated, allylated and arylated compounds of the alkali metals. Specific examples thereof include ethyllithium, n-butyllithium, sec-butyllithium, tert-butyllithium, ethylsodium, lithiumbiphenyl, lithium naphthalene, lithiumtriphenyl, sodium naphthalene, α-methylstyrene sodium dianion, 1,1-diphenylhexyllithium, and 1,1-diphenyl-3-methylpentyllithium.

After the completion of a synthetic reaction of arm part polymers, an aliphatic carboxylic acid ester is added to the reaction solution to produce a star polymer.

Arm part polymers and an aliphatic carboxylic acid ester may be added at a ratio appropriately selected according to number of ester groups in the aliphatic carboxylic acid ester. However, since up to 2 mol of arm part polymers can be bound to 1 mol of ester groups, it is preferred to add arm part polymers in 2-times or more molar amount relative to the number of ester groups in the aliphatic carboxylic acid ester.

However, when arm part polymers are used in a large excess amount, generation of linear polymers, that remain unreacted with the aliphatic carboxylic acid ester, cannot be avoided so that it is preferred to add arm part polymers in 2.0 to 4.0-times molar amount relative to the number of ester groups in the aliphatic carboxylic acid ester. It is more preferred to add in 2.05 to 2.5-times molar amount in order to decrease the remaining amount of unreacted linear polymers to such an extent that the physical properties of a desired star polymer can be expressed.

On the other hand, a star polymer not containing linear polymers can be prepared by adjusting the amount of arm part polymers to be added. It suffices if 2.0-times or less molar amount of arm part polymers are added relative to the number of ester groups in the aliphatic carboxylic acid ester. If the addition amount is too little, it results in a star polymer having insufficient number of arms. Therefore, it is preferred to add arm part polymers in 1.5 to 2.0-times molar amount relative to the number of ester groups in the aliphatic carboxylic acid ester, and further preferably in 1.8 to 2.0-times molar amount.

In this reaction, a polymer has controlled structure with narrow dispersion of molecular weights can be obtained usually by conducting a polymerization reaction in an organic solvent at a temperature of −100 to 50° C., preferably −78 to 40° C., under an inert gas atmosphere such as nitrogen and argon. Further, reaction for generating a star polymer can be conducted sequentially in a solvent used for forming arm part polymers and also can be conducted by changing the composition by the addition of a solvent or by replacing the solvent with other solvent. As such solvents, those solvents same as the organic solvents used in the synthetic reaction of arm part polymers may be used.

According to the present invention, star polymers having, for example, a homopolymer or copolymer of hydroxystyrene as the arm parts can be appropriately produced. Usually, however, the star polymers are produced by polymerizing a monomer having attached a protective group for a hydroxy group, thereby obtaining a star polymer, and then by conducting a deprotection by a known method.

EXAMPLES

The Examples are explained below, but the technical scope of the present invention shall not be limited to these Examples.

Example 1

To a nitrogen-substituted 500 mL four-necked flask, 25.5 g of dehydrated tetrahydrofuran (hereinafter abbreviated to THF), 229.2 g of dehydrated toluene, and 3.6 g (31.0 mmol) of N,N,N',N'-tetramethylethylenediamine (hereinafter abbreviated to TMEDA) were added and the reaction system was kept at −40° C. under stirring. To the reaction system, 11.9 g (28.7 mmol) of a n-butyllithium/hexane (hereinafter abbreviated to NBL) solution at 1.6 mol/L was added. 10 min later, 45.5 g (257.9 mmol) of p-tert-butoxystyrene was added to the reaction system to conduct polymerization. Sampling was conducted 20 min after the drop-wise addition was terminated, and the completion of polymerization was confirmed by gas chromatography (hereinafter abbreviated to GC). Part of this polymer solution was sampled and subjected to an analysis using gel permeation chromatography (hereinafter abbreviated to GPC), which demonstrated a unimodal polymer having a number average molecular weight Mn of 2,020 and dispersion degree Mw/Mn of 1.07.

To this reaction system, 1.2 g (5.9 mmol) of diethyl adipate was added and the reaction was continued for 30 min and then stopped by the addition of 5 mL methanol. GPC analysis of this polymer solution demonstrated a polymer having a number average molecular weight Mn of 5,330 and having the main peak at a dispersion degree Mw/Mn of 1.03. The amount of the residual arms was about 23%. Further, measurement with a multiangle laser light scattering detector (hereinafter abbreviated to GPC-MALLS) confirmed a star polymer comprised of 4 branches and having a molecular weight Mw of 8,800.

The polymerization solution was diluted by the addition of 300 mL ethyl acetate and washed 4 times with water. After the solvent had been distilled away, the solution was adjusted to a 20% THF/ethanol (5/1) solution. Thereto, 35% hydrochloric acid was added at 0.66 eq. relative to the resin content and refluxed for 3 hours. The solution was diluted by the addition of 300 mL ethyl acetate, and washed 3 times with water. After the solvent had been distilled away, the resultant solution was adjusted to a 35% ethanol solution and placed into a large amount of water to precipitate a polymer. After filtration, the precipitate was dried at 50° C. for 20 hours under vacuum to obtain 31.9 g of a white powdery polymer. GPC analysis of this polymer demonstrated a star polymer having a number average molecular weight Mn of 4,360 and having the main peak at a dispersion degree Mw/Mn of 1.03.

Example 2

A similar operation as above was carried out to synthesize a unimodal polymer having a number average molecular weight Mn of 2,070 and a dispersion degree Mw/Mn of 1.07, to which diethyl sebacate was added instead of diethyl adipate. GPC analysis of this polymer solution demonstrated a polymer having a number average molecular weight Mn of 5,870 and having the main peak at a dispersion degree Mw/Mn of 1.03. The amount of the residual arms was about 10%. Further, a GPO-MALLS measurement confirmed a star polymer comprised of 4 branches and having a molecular weight Mw of 9,000.

The polymerization solution was diluted by the addition of 300 mL ethyl acetate and washed 4 times with water. After the solvent had been distilled away, the solution was adjusted to a 20% THF/ethanol (5/1) solution. Thereto, 35% hydrochloric acid was added at 0.66 eq. relative to the resin content and refluxed for 3 hours. The solution was diluted by the addition of 300 mL ethyl acetate, and washed 3 times with water. After the solvent had been distilled away, the resultant solution was adjusted to a 35% ethanol solution and placed into a large amount of water to precipitate a polymer. After filtration, the precipitate was dried at 50° C. for 20 hours under vacuum to obtain 36.8 g of a white powdery polymer. GPC analysis of this polymer demonstrated a star polymer having a number average molecular weight Mn of 4,850 and having the main peak at a dispersion degree Mw/Mn of 1.03.

Example 3

To a nitrogen-substituted 500 mL four-necked flask, 16.0 g of THF, 303.3 g of dehydrated toluene, and 2.2 g (18.9 mmol) of TMEDA were added and the reaction system was kept at −40° C. under stirring. To the reaction system, 7.6 g (18.2 mmol) of a NBL solution at 1.6 mol/L was added. 10 min later, the reaction system was added 80.3 g (8.3 mmol) of p-tert-butoxystyrene to conduct polymerization. Sampling was conducted 20 min after the drop-wise addition was terminated, and the completion of polymerization was confirmed by GC. Part of this polymer solution was sampled and subjected to a GPC analysis which demonstrated a unimodal polymer having a number average molecular weight Mn of 4,660 and dispersion degree Mw/Mn of 1.04.

To this reaction system, 1.3 g (5.0 mmol) of diethyl sebacate was added and the reaction was continued for 30 min and then stopped by the addition of 5 mL methanol. GPC analysis of this polymer solution demonstrated a polymer having a number average molecular weight Mn of 12,830 and having the main peak at a dispersion degree Mw/Mn of 1.05. The amount of the residual arms was about 12%. Further, a GPO-MALLS measurement confirmed a star polymer comprised of 4 branches and having a molecular weight Mw of 21,000.

The polymerization solution was diluted by the addition of 500 mL ethyl acetate and washed 4 times with water. After the solvent had been distilled away, the solution was adjusted to a 20% THF/ethanol (5/1) solution. Thereto, 35% hydrochloric acid was added at 0.66 eq. relative to the resin content and refluxed for 3 hours. The solution was diluted by the addition of 500 mL ethyl acetate, and washed 3 times with water. After the solvent had been distilled away, the resultant solution was adjusted to a 35% ethanol solution and placed into a large amount of water to precipitate a polymer. After filtration, the precipitate was dried at 50° C. for 20 hours under vacuum to obtain 55.9 g of a white powdery polymer. GPC analysis of this polymer demonstrated a star polymer having a number average molecular weight Mn of 10,120 and having the main peak at a dispersion degree Mw/Mn of 1.05.

(Measurement of Alkaline Dissolution Rate)

The dissolution rate in an alkaline developing solution was measured as follows. Measurement was conducted at a film thickness of about 1 μm.

Solvent: Ethyl lactate
Resin concentration: 20%
Substrate: Silicon wafer; 20×20 mm$^2$
Application method: Spin coating; 2000 r.p.m.×30 sec
Baking condition: 110° C., 90 sec
Developing solution: 2.38% aqueous tetramethylammonium hydroxide solution
Measurement temperature: 23° C.

Measurement method: Eye observation

A star polymer was prepared in an ethyl lactate at 20% by weight and spin-coated onto a silicon wafer. The coated silicon wafer was dried on a hot plate and dipped in a developing solution of 23° C. Then, dissipation of the resin film was observed by eye observation. Dissolution rate was calculated based on the film thickness measured in advance and the time spent until the resin film was completely dissipated. The results are shown in Table 1.

| | Material | | Product (Arm parts are polyhydroxystyrene) | | | | |
|---|---|---|---|---|---|---|---|
| | Arm parts (PTBS) | | Molecular weight | | | Dissolution | Residual |
| Core part | Mn | Mw/Mn | Mn | Mw/Mn | Number of arms | rate nm/sec | arms Area % |
| Ex. 1 | DA | 2020 | 1.07 | 4360 | 1.03 | 4 | 270 | 23.3 |
| Ex. 2 | DS | 2070 | 1.07 | 4850 | 1.03 | 4 | 154 | 9.7 |
| Ex. 3 | DS | 4660 | 1.04 | 10120 | 1.05 | 4 | 95 | 11.9 |

DA: Diethyl adipate
DS: Diethyl sebacate
PTBS: p-t-butoxypolystyrene

For star polymers of Examples 1 to 3, uniform dissolution was observed on the entire surface of the membrane.

INDUSTRIAL APPLICABILITY

The present invention provides a styrene-based star polymer with narrow dispersion and a superior alkaline dissolution rate by using a polyvalent aliphatic carboxylic acid ester as the core part. The star polymers of the present invention thus are suitable as a resist material, etc.

The invention claimed is:

1. A star polymer represented by the formula:

$$A[C(Y)X_m]_n$$

wherein:
  A represents a polyvalent aliphatic hydrocarbon group having 4-15 carbons,
  C represents a carbon atom,
  X represents a homopolymer chain of hydroxystyrene,
  Y represents a hydroxy group or an oxo group,
  m represents an integer of 1 or 2, and
  n represents any integer from 2 to 5,
with the proviso that if Y is a hydroxy group, m is 2, and if Y is an oxo group, m is 1.

2. A method for producing the star polymer according to claim 1, comprising reacting a homopolymer chain of hydroxystyrene having an anionic end with an aliphatic carboxylic acid ester represented by:

$$A(COOR)_n$$

wherein:
  R represents an alkyl group having 1-8 carbons,
  A represents a polyvalent aliphatic hydrocarbon group having 4-15 carbons,
  n represents any integer from 2 to 5.

* * * * *